(12) United States Patent
Fukukawa et al.

(10) Patent No.: US 9,752,030 B2
(45) Date of Patent: Sep. 5, 2017

(54) POLYAMIC ACID AND POLYIMIDE, PROCESSES FOR THE PRODUCTION OF SAME, COMPOSITIONS CONTAINING SAME, AND USES THEREOF

(75) Inventors: Kenichi Fukukawa, Shinagawa-ku (JP); Masaki Okazaki, Ichihara (JP); Yoshihiro Sakata, Ichikawa (JP); Ichiro Fujio, Nagaokakyo (JP); Wataru Yamashita, Ichihara (JP)

(73) Assignee: MITSUI CHEMICALS, INC., Tokyo (JP)

(*) Notice: Subject to any disclaimer, the term of this patent is extended or adjusted under 35 U.S.C. 154(b) by 628 days.

(21) Appl. No.: 13/203,343

(22) PCT Filed: Feb. 26, 2010

(86) PCT No.: PCT/JP2010/001332
§ 371 (c)(1),
(2), (4) Date: Aug. 25, 2011

(87) PCT Pub. No.: WO2010/100874
PCT Pub. Date: Sep. 10, 2010

(65) Prior Publication Data
US 2011/0318588 A1    Dec. 29, 2011

(30) Foreign Application Priority Data
Mar. 4, 2009 (JP) .................. 2009-051102

(51) Int. Cl.
| | | |
|---|---|---|
| *C08L 79/08* | (2006.01) | |
| *B32B 15/08* | (2006.01) | |
| *B32B 15/20* | (2006.01) | |
| *B32B 27/34* | (2006.01) | |
| *B32B 27/36* | (2006.01) | |
| *C09D 179/08* | (2006.01) | |
| *C08G 73/10* | (2006.01) | |
| *H05K 1/03* | (2006.01) | |

(52) U.S. Cl.
CPC .............. *C08L 79/08* (2013.01); *B32B 15/08* (2013.01); *B32B 15/20* (2013.01); *B32B 27/34* (2013.01); *B32B 27/36* (2013.01); *C08G 73/1082* (2013.01); *C09D 179/08* (2013.01); *H05K 1/0346* (2013.01); *Y10T 428/31681* (2015.04)

(58) Field of Classification Search
CPC ......... C08L 79/08; B32B 15/08; B32B 15/20; B32B 27/34; B32B 27/36; C09D 179/08; C08G 73/1082; Y10T 428/31681; H05K 1/0346
See application file for complete search history.

(56) References Cited

U.S. PATENT DOCUMENTS

| | | | |
|---|---|---|---|
| 5,969,187 A | 10/1999 | Okawa et al. | |
| 6,100,430 A * | 8/2000 | Yamamoto et al. | .......... 564/455 |
| 2003/0104232 A1 | 6/2003 | Kihara et al. | |
| 2005/0101756 A1 * | 5/2005 | Liaw | .............. 528/170 |
| 2007/0078216 A1 * | 4/2007 | Cao et al. | ................ 524/497 |
| 2008/0305346 A1 * | 12/2008 | Yanagida et al. | ........... 428/473.5 |
| 2010/0143729 A1 * | 6/2010 | Kikuchi et al. | ............... 428/458 |

FOREIGN PATENT DOCUMENTS

| | | | |
|---|---|---|---|
| JP | 58-017418 A | 2/1983 | |
| JP | 3-044625 A | 2/1991 | |
| JP | 10-306066 A | 11/1998 | |
| JP | 2002-161136 A | 6/2002 | |
| JP | 2003-141936 A | 5/2003 | |
| JP | 2003-212995 A | 7/2003 | |
| JP | 2003-212996 A | 7/2003 | |
| JP | 2006-003476 A | 1/2006 | |
| JP | 2006-152247 A | 6/2006 | |
| JP | 2006-291003 A | 10/2006 | |
| JP | 2006-321924 A | 11/2006 | |
| JP | 2007-231224 | * 9/2007 | |

OTHER PUBLICATIONS

A. Bell, J. G. Smith, C. J. Kibler, J. Polym. Sci., Polym. Chem. Ed. 1965, 3, 19).*
Hasegawa, Masatoshi "Polyimides containing trans ,14-cyclohexane Unit Polymerizability of their precursors and low-CTE, low-K and high Tg properties" High Performance Polymers: vol. 15; Mar. 2003 p. 47-64.*
Siddharth Dasgupta, "Crystal Structures and Properties of Nylon Polymers from Theory" J. Am. Chem. Soc. 1996, 118, 12291-12301.*

(Continued)

*Primary Examiner* — Kevin R Kruer
(74) *Attorney, Agent, or Firm* — Buchanan, Ingersoll & Rooney PC

(57) ABSTRACT

The purpose of the present invention is to provide a polyimide resin which exhibits higher heat resistance than that of a conventional polyimide resin by controlling the geometric configuration of the constituent units. Provided is a polyamic acid which comprises repeating units represented by general formula (1), wherein the 1,4-bismethylenecyclohexane skeleton units consist of both trans- and cis-form units, and the contents of the trans- and cis-form units are 60 to 100% and 0 to 40% respectively (with the sum total of the trans- and cis-form units being 100%).

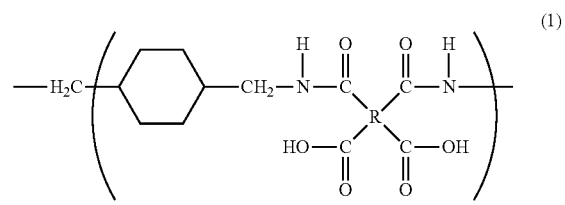

(1)

17 Claims, No Drawings

(56) References Cited

OTHER PUBLICATIONS

Keith Marchildon, "Polyamides—Still Strong After Seventy Years" Macromolecular Journals, 2011, 5, 22-54.*
International Search Report (PCT/ISA/210) issued on Apr. 27, 2010, by Japanese Patent Office as the International Searching Authority for International Application No. PCT/JP2010/001332.

* cited by examiner

POLYAMIC ACID AND POLYIMIDE, PROCESSES FOR THE PRODUCTION OF SAME, COMPOSITIONS CONTAINING SAME, AND USES THEREOF

This application is a U.S. National Phase application under 35 U.S.C. 371 of International Application No. PCT/JP2010/001332, filed on Feb. 26, 2010, and claims benefit to Japanese Patent Application 2009-051102, filed on Mar. 4, 2009.

TECHNICAL FIELD

The present invention relates to polyimide materials. More specifically, the present invention relates to polyimide materials composed of polyamic acid having a specific diamine unit with controlled geometric isomerism, and to processes for producing the same.

BACKGROUND ART

Polyimides generally have superior heat resistance, mechanical properties and electrical characteristics compared to other general-purpose resins and engineering plastics. And also, wide applications of polyimides are founded such as molding materials, composite materials, electrical and electronics materials, optical materials, etc. Meanwhile, the use of lead-free solder in the manufacture of electrical circuits, including flexible printed boards, has become mainstream due to the increasing trend in environmental issues. Due to the high reflow temperature required for lead-free solder, polyimides that offer higher heat resistance than conventional ones are in increasing demand.

One effective technique for increasing the glass transition temperature (Tg) of polyimide resin is to optimize the monomer skeleton that constitutes the polyimide. For example, a diamine compound or tetracarboxylic dianhydride having a particular structure is introduced or copolymerized with conventional polyimide structure in an aim to improve the physical properties, such as heat resistance and/or mechanical properties, of the polyimide (see, e.g., Patent Literatures 1 and 2). However, new monomers are sometimes not versatile materials because of possible adverse effects on other physical properties, the difficulty with which they are synthesized, or the use of expensive raw materials.

Another effective technique for increasing the Tg of the resin is to introduce a functional group that undergoes thermal crosslinking into a terminal of the polyimide (see Patent Literature 3). However, this method involves altering the molar ratio between the added monomers. This inevitably results in a decrease in the molecular weight of the polyimide resin, possibly affecting its physical properties.

Under the foregoing circumstances, there has been a growing demand for technology that can increase the heat resistance of polyimide to a level higher than that of conventional one without changing its primary structure.

Bis(aminomethyl)cyclohexane is a diamine having an alicyclic structure. Thus, a polyimide prepared by reaction of this compound with an aromatic tetracarboxylic dianhydride is a semi-aromatic polyimide, a compound that exhibits high transparency (see Patent Literature 4). For this reason, bis(aminomethyl)cyclohexane holds great promise for future applications.

Bis(aminomethyl)cyclohexane has two structural isomers: 1,3-bis(aminomethyl)cyclohexane and 1,4-bis(aminomethyl)cyclohexane, each of which is known to exist as two geometric isomers: cis-trans isomers.

CITATION LIST

Patent Literature

[PTL 1] Japanese Patent Application Laid-Open No. 2003-212995
[PTL 2] Japanese Patent Application Laid-Open No. 2003-212996
[PTL 3] Japanese Patent Application Laid-Open No. 2006-291003
[PTL 4] Japanese Patent Application Laid-Open No. 2003-141936

SUMMARY OF INVENTION

Technical Problem

In view of the foregoing problems pertinent in the art, it is therefore an object of the present invention to provide a polyimide resin having higher heat resistance than conventional one by controlling the geometric isomerism of a constituent unit without changing the primary structure of the polyimide resin.

Solution to Problem

The inventors completed the present invention by discovering that the glass transition temperature (Tg) of polyimide having 1,4-bis(aminomethyl)cyclohexane as a diamine unit is correlated with the cis/trans ratio of 1,4-bis(aminomethyl)cyclohexane.

A first aspect of the present invention thus relates to polyamic acids and the like given below.

[1] A polyamic acid having a repeating unit represented by general formula (1),
wherein a 1,4-bismethylenecyclohexane skeleton (X) in general formula (1) consists of a trans isomer represented by formula (X1) and a cis isomer represented by formula (X2), and
a content of the trans isomer is 60% to 100%, and a content of the cis isomer is 0% to 40%, with respect to the total content of the cis and trans isomers being 100%,

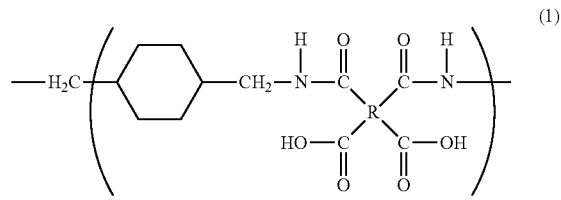

where R is a tetravalent group having 4 to 27 carbon atoms, and denotes an aliphatic group, a monocyclic aliphatic group, a condensed polycyclic aliphatic group, a monocyclic aromatic group, a condensed polycyclic aromatic group, a non-condensed polycyclic aliphatic group in which alicyclic groups are mutually bonded to each other either directly or via a crosslinking member, or a non-condensed polycyclic aromatic group in which aromatic groups are mutually bonded to each other either directly or via a crosslinking member.

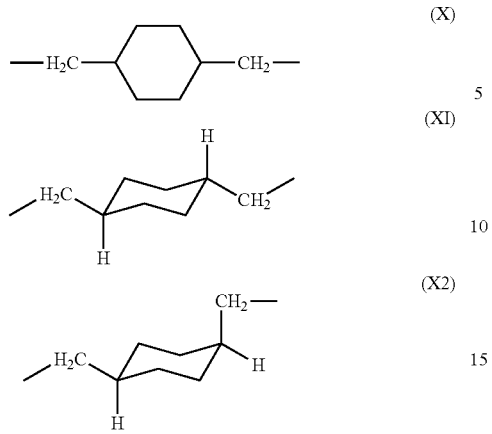

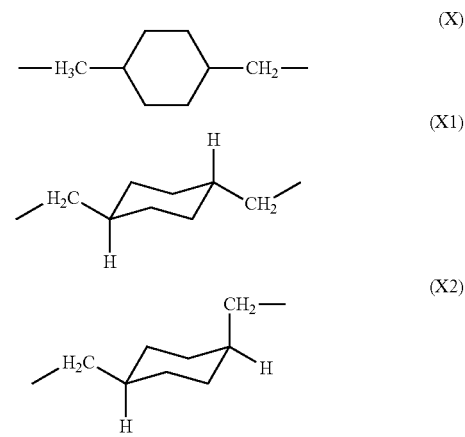

[2] The polyamic acid according to [1], wherein the content of the trans isomer is 80% to 100%, and the content of the cis isomer is 0% to 20%, with respect to the total content of the cis and trans isomers being 100%.

[3] The polyamic acid according to [1] or [2], wherein a logarithmic viscosity of the polyamic acid in N-methyl-2-pyrrolidone is 0.1 to 3.0 g/dl, as measured at 35° C. and at a polyamic acid concentration of 0.5 g/dl.

[4] A polyamic acid varnish including the polyamic acid according to any one of [1] to [3].

[5] A metal clad laminate obtained by laminating together a polyimide film prepared from the polyamic acid varnish according to [4] and a metal foil.

A second aspect of the present invention relates to polyimides and the like given below.

[6] A polyimide having a repeating unit represented by general formula (2), wherein a 1,4-bismethylenecyclohexane skeleton (X) in general formula (2) consists of a trans isomer represented by formula (X1) and a cis isomer represented by formula (X2), and a content of the trans isomer is 60% to 100%, and a content of the cis isomer is 0% to 40%, with respect to the total content of the cis and trans isomers being 100%,

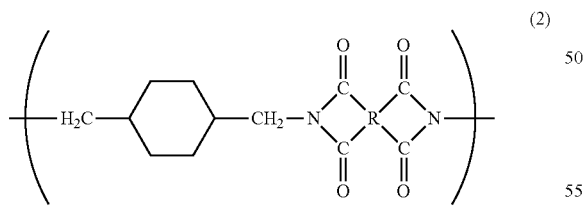

where R is a tetravalent group having 4 to 27 carbon atoms, and denotes an aliphatic group, a monocyclic aliphatic group, a condensed polycyclic aliphatic group, a monocyclic aromatic group, a condensed polycyclic aromatic group, a non-condensed polycyclic aliphatic group in which alicyclic groups are mutually bonded to each other either directly or via a crosslinking member, or a non-condensed polycyclic aromatic group in which aromatic groups are mutually bonded to each other either directly or via a crosslinking member.

[7] The polyimide according to [6], wherein the content of the trans isomer is 80% to 100%, and the content of the cis isomer is 0% to 20%, with respect to the total content of the cis and trans isomers being 100%.

[8] The polyimide according to [6] or [7], wherein a logarithmic viscosity of the polyimide in a 9:1 (weight ratio) mixture solvent of p-chlorophenol and phenol is 0.1 to 3.0 dl/g, as measured at 35° C. and at a polyimide concentration of 0.5 g/dl.

[9] A polyimide film including the polyimide according to any one of [6] to [8].

[10] The polyimide film according to [9], wherein a glass transition temperature is 250° C. or above.

[11] A metal clad laminate obtained by laminating together the polyimide film according to [9] and a metal foil.

A third aspect of the present invention relates to processes for producing a polyamic acid and the like given below.

[12] A process for producing the polyamic acid according to [1], including:

reacting together a trans isomer of 1,4-bis(aminomethyl)cyclohexane represented by formula (Y1), a cis isomer of 4-bis(aminomethyl)cyclohexane represented by formula (Y2), and a tetracarboxylic dianhydride represented by formula (3), wherein a content of the trans isomer represented by formula (Y1) is 60% to 100%, and a content of the cis isomer represented by formula (Y2) is 0% to 40%, with respect to the total content of the cis and trans isomers being 100%,

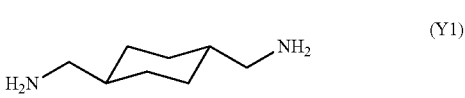

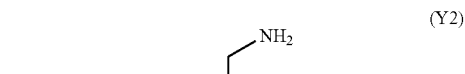

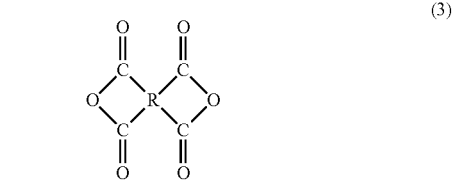

where R is a tetravalent group having 4 to 27 carbon atoms, and denotes an aliphatic group, a monocyclic aliphatic group, a condensed polycyclic aliphatic group, a monocyclic aromatic group, a condensed polycyclic aromatic group, a non-condensed polycyclic aliphatic group in which alicyclic groups are mutually bonded to each other either directly or via a crosslinking member, or a non-condensed polycyclic aromatic group in which aromatic groups are mutually bonded to each other either directly or via a crosslinking member.

[13] The process according to [12], wherein the content of the trans isomer represented by formula (Y1) is 80% to 100%, and the content of the cis isomer represented by formula (Y2) is 0% to 20%, with respect to the total content of the cis and trans isomers being 100%.

[14] A process for producing a polyimide including:
thermally or chemically imidizing a polyamic acid obtained in [12] or [13].

A fourth aspect of the present invention relates to a display substrate material and the like containing polyimide.

[15] A polyimide resin composition including:
the polyimide according to any one of [6] to [8]; and
a coloring agent.

[16] The polyimide resin composition according to [15], wherein the coloring agent is a whitening agent.

[17] The polyimide resin composition according to [16], wherein the whitening agent is titanium oxide.

[18] A polyamic acid composition including:
the polyamic acid according to any one of [1] to [3]; and
a coloring agent.

[19] The polyamic acid composition according to [18], wherein the coloring agent is a whitening agent.

[20] The polyamic acid composition according to [19], wherein the whitening agent is titanium oxide.

[21] A display substrate material including the polyimide according to any one of [6] to [8] or the polyimide resin composition according to any one of [15] to [17].

[22] A circuit board material including the polyimide according to any one of [6] to [8] or the polyimide resin composition according to any one of [15] to [17].

[23] A coating material including the polyimide according to any one of [6] to [8] or the polyimide resin composition according to any one of [15] to [17].

[24] A light reflector including the polyimide resin composition according to [16] or [17] as a light reflecting material.

Advantageous Effects of Invention

The present invention is a technology that may significantly increases the glass transition temperature of polyimide resin without impairing its inherent properties. For example, by controlling the geometric isomerism of a monomeric unit of the polyimide, it is possible to increase the glass transition temperature of the polyimide resin without triggering possible molecular weight reduction caused by introduction of a reactive terminal group to the polyimide. The present invention thus provides a polyimide resin having higher heat resistance than conventional ones. The polyimide resin is suitable for coating materials, display materials for displays, and circuit board materials, for example.

DESCRIPTION OF EMBODIMENTS

1. Polyamic Acid

A polyamic acid of the present invention has a repeating unit represented by the general formula (1) below. Specifically, the polyamic acid has a repeating unit having a diamine unit derived from 1,4-bis(aminomethyl)cyclohexane.

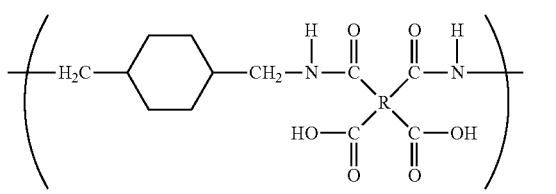

The unit derived from 1,4-bis(aminomethyl)cyclohexane is composed of an aliphatic compound. Accordingly, the polyamic acid of the present invention may exhibit high transparency to UV light and visible light compared to a polyamic acid having an aromatic compound as a diamine unit.

The unit (X) derived from 1,4-bis(aminomethyl)cyclohexane constituting the polyamic acid of the present invention may exist as one of the two geometric isomers (cis-trans isomers) shown below. The trans isomer unit is represented by formula (X1), and the cis isomer unit is represented by formula (X2).

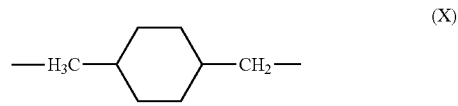

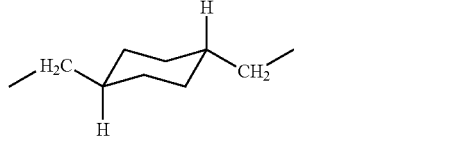

The cis/trans ratio of the unit derived from 1,4-bis(aminomethyl)cyclohexane is preferably 40/60 to 0/100, more preferably 20/80 to 0/100. The glass transition temperature of the polyimide prepared from the polyamic acid of the present invention can be controlled by changing the cis/trans ratio of the diamine unit derived from 1,4-bis(aminomethyl)cyclohexane. Namely, as the ratio of trans isomer (X1) increases, so too does the glass transition temperature, i.e., heat resistance, of the resultant polyimide.

The cis/trans ratio of the diamine unit derived from 1,4-bis(aminomethyl)cyclohexane, which is contained in the polyamic acid, can be measured by NMR.

The above cis/trans ratio can be adjusted by changing the cis/trans ratio of 1,4-bis(aminomethyl)cyclohexane, a raw monomer material of a polyamic acid. Namely, 1,4-bis(aminomethyl)cyclohexane yields a polyamic acid by reaction with an acid dianhydride while retaining its geometric isomerism.

As a diamine unit of the polyamic acid, a unit derived from a diamine other than 1,4-bis(aminomethyl)cyclohexane may be contained. By way of example, a 1,4-bis (aminomethyl)cyclohexane-derived diamine unit and one or more other diamine units may be randomly distributed in the polyamic acid. It should be noted, however, that the 1,4-bis (aminomethyl)cyclohexane-derived diamine unit preferably accounts for 10 to 100 mol % of the total diamine unit in the polyamic acid.

There are no particular limitations on diamines other than 1,4-bis(aminomethyl)cyclohexane (other diamines) as long as a polyamic acid or polyimide can be prepared.

The first examples of other diamines are diamines having benzene ring(s). Examples of diamines having benzene ring(s) include:

<1> diamines having one benzene ring, such as p-phenylenediamine, m-phenylenediamine, p-xylylenediamine, and m-xylylenediamine;

<2> diamines having two benzene rings, such as 3,3'-diaminodiphenylether, 3,4'-diaminodiphenylether, 4,4'-diaminodiphenylether, 3,3'-diaminodiphenylsulfide, 3,4'-diaminodiphenylsulfide, 4,4'-di amino diphenyl sulfide, 3,3'-diaminodiphenylsulfone, 3,4'-diaminodiphenylsulfone, 4,4'-diaminodiphenylsulfone, 3,3'-diaminobenzophenone, 4,4'-diaminobenzophenone, 3,4'-diaminobenzophenone, 3,3'-diaminodiphenylmethane, 4,4'-di aminodiphenylmethane, 3,4'-diaminodiphenylmethane, 2,2-di(3-aminophenyl)propane, 2,2-di(4-aminophenyl)propane, 2-(3-aminophenyl)-2-(4-aminophenyl)propane, 2,2-di(3-aminophenyl)-1,1,1,3,3,3-hexafluoropropane, 2,2-di(4-aminophenyl)-1,1,1,3,3,3-hexafluoropropane, 2-(3-aminophenyl)-2-(4-aminophenyl)-1,1,1,3,3,3-hexafluoropropane, 1,1-di(3-aminophenyl)-1-phenylethane, 1,1-di(4-aminophenyl)-1-phenylethane, and 1-(3-aminophenyl)-1-(4-aminophenyl)-1-phenylethane;

<3> diamines having three benzene rings, such as 1,3-bis (3-aminophenoxy)benzene, 1,3-bis(4-aminophenoxy)benzene, 1,4-bis(3-aminophenoxy)benzene, 1,4-bis(4-aminophenoxy)benzene, 1,3-bis(3-aminobenzoyl)benzene, 1,3-bis(4-aminobenzoyl)benzene, 1,4-bis(3-aminobenzoyl)benzene, 1,4-bis(4-aminobenzoyl)benzene, 1,3-bis(3-amino-α,α-dimethylbenzyl)benzene, 1,3-bis(4-amino-α,α-dimethylbenzyl)benzene, 1,4-bis(3-amino-α,α-dimethylbenzyl)benzene, 1,4-bis(4-amino-α,α-dimethylbenzyl)benzene, 1,3-bis(3-amino-α,α-ditrifluoromethylbenzyl)benzene, 1,3-bis(4-amino-α,α-ditrifluoromethylbenzyl)benzene, 1,4-bis(3-amino-α,α-ditrifluoromethylbenzyl)benzene, 1,4-bis(4-amino-α,α-ditrifluoromethylbenzyl)benzene, 2,6-bis(3-aminophenoxy) benzonitrile, and 2,6-bis(3-aminophenoxy)pyridine;

<4> diamines having four benzene rings, such as 4,4'-bis (3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy) phenyl]sulfide, bis[4-(4-aminophenoxy)phenyl]sulfide, bis [4-(3-aminophenoxy)phenyl]sulfone, bis[4-(4-aminophenoxy)phenyl]sulfone, bis[4-(3-aminophenoxy) phenyl]ether, bis[4-(4-aminophenoxy)phenyl]ether, 2,2-bis [4-(3-aminophenoxy)phenyl]propane, 2,2-bis[4-(4-aminophenoxy)phenyl]propane, 2,2-bis[3-(3-aminophenoxy)phenyl]-1,1,1,3,3,3-hexafluoropropane, and 2,2-bis[4-(4-aminophenoxy)phenyl]-1,1,1,3,3,3-hexafluoropropane;

<5> diamines having five benzene rings, such as 1,3-bis [4-(3-aminophenoxy)benzoyl]benzene, 1,3-bis[4-(4-aminophenoxy)benzoyl]benzene, 1,4-bis[4-(3-aminophenoxy) benzoyl]benzene, 1,4-bis[4-(4-aminophenoxy)benzoyl] benzene, 1,3-bis[4-(3-aminophenoxy)-α,α-dimethylbenzyl] benzene, 1,3-bis[4-(4-aminophenoxy)-α,α-dimethylbenzyl] benzene, 1,4-bis[4-(3-aminophenoxy)-α,α-dimethylbenzyl] benzene, and 1,4-bis[4-(4-aminophenoxy)-α,α-dimethylbenzyl]benzene; and <6> diamines having six benzene rings, such as 4,4'-bis [4-(4-aminophenoxy)benzoyl]diphenylether, 4,4'-bis[4-(4-amino-α,α-dimethylbenzyl)phenoxy]benzophenone, 4,4'-bis[4-(4-amino-α,α-dimethylbenzyl)phenoxy] diphenylsulfone, and 4,4'-bis[4-(4-aminophenoxy)phenoxy] diphenylsulfone.

The second examples of other diamines include diamines having aromatic substituent(s), such as 3,3'-diamino-4,4'-diphenoxybenzophenone, 3,3'-diamino-4,4'-dibiphenoxybenzophenone, 3,3'-diamino-4-phenoxybenzophenone, and 3,3'-diamino-4-biphenoxybenzophenone.

The third examples of other diamines include diamines having a spirobiindan ring, such as 6,6'-bis(3-aminophenoxy)-3,3,3',3'-tetramethyl-1,1'-spirobiindan, and 6,6'-bis(4-aminophenoxy)-3,3,3',3'-tetramethyl-1,1'-spirobiindan.

The fourth examples of other diamines include siloxane diamines, such as 1,3-bis(3-aminopropyl)tetramethyldisiloxane, 1,3-bis(4-aminobutyl)tetramethyldisiloxane, α,ω-bis(3-aminopropyl)polydimethylsiloxane, and α,ω-bis(3-aminobutyl)polydimethylsiloxane.

The fifth examples of other diamines include ethylene glycol diamines, such as bis(aminomethyl)ether, bis(2-aminoethyl)ether, bis(3-aminopropyl)ether, bis[2-(2-aminomethoxy)ethyl]ether, bis[2-(2-aminoethoxy)ethyl]ether, bis[2-(3-aminoprotoxy)ethyl]ether, 1,2-bis(aminomethoxy) ethane, 1,2-bis(2-aminoethoxy)ethane, 1,2-bis[2-(aminomethoxy)ethoxy]ethane, 1,2-bis[2-(2-aminoethoxy) ethoxy]ethane, ethylene glycol bis(3-aminopropyl)ether, diethylene glycol bis(3-aminopropyl)ether, and triethylene glycol bis(3-aminopropyl)ether.

The sixth examples of other diamines include alkylenediamines, such as ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, and 1,12-diaminododecane.

The seventh examples of other diamines include alicyclic diamines, such as cyclobutanediamine, cyclohexanediamine, di(aminomethyl)cyclohexane [or bis(aminomethyl) cyclohexanes (except for 1,4-bis(aminomethyl)cyclohexane)], diaminobicycloheptane, diaminomethylbicycloheptane (including norbornanediamines, such as norbornanediamine), diaminooxybicycloheptane, diaminomethyloxybicycloheptane (including oxanorbornanediamine), isophoronediamine, diaminotricyclodecane, diaminomethyltricyclodecane, bis (aminocyclohexyl)methane [or methylenebis(cyclohexylamine)], and bis(aminocyclohexyl)isopropylidene.

There are no particular limitations on the tetracarboxylic acid unit that constitutes the polyamic acid of the present invention. Namely, substituent R in general formula (1) may be a tetravalent organic group having 4 to 27 carbon atoms. Substituent R may be an aliphatic group, a monocyclic aliphatic group, a condensed polycyclic aliphatic group, a monocyclic aromatic group, or a condensed polycyclic aromatic group. Alternatively, substituent R may be a non-condensed polycyclic aliphatic group in which alicyclic groups are mutually bonded to each other either directly or via a crosslinking member, or a non-condensed polycyclic aromatic group in which aromatic groups are mutually bonded to each other either directly or via a crosslinking member.

Substituent R in general formula (1) is a group derived from a tetracarboxylic dianhydride, a raw material of the polyamic acid or polyimide of the present invention. There are no particular limitations on the tetracarboxylic dianhydride as long as the polyamic acid or polyimide can be prepared. The tetracarboxylic dianhydride may be an aromatic tetracarboxylic dianhydride or alicyclic tetracarboxylic dianhydride, for example.

Examples of aromatic tetracarboxylic dianhydrides include pyromellitic dianhydride, 3,3',4,4'-biphenyltetracarboxylic dianhydride, 3,3',4,4'-benzophenonetetracarboxylic dianhydride, bis(3,4-dicarboxyphenyl)ether dianhydride, bis (3,4-dicarboxyphenyl)sulfide dianhydride, bis(3,4-dicarboxyphenyl)sulfone dianhydride, bis(3,4-dicarboxyphenyl)methane dianhydride, 2,2-bis(3,4-dicarboxyphenyl)propane dianhydride, 2,2-bis(3,4-dicarboxyphenyl)-1,1,1,3,3,3-hexafluoropropane dianhydride, 1,3-bis(3,4-dicarboxyphenoxy)benzene dianhydride, 1,4-bis(3,4-dicarboxyphenoxy) benzene dianhydride, 4,4'-bis(3,4-dicarboxyphenoxy) biphenyl dianhydride, 2,2-bis[(3,4-dicarboxyphenoxy) phenyl]propane dianhydride, 2,3,6,7-naphthalenetetracarboxylic dianhydride, 1,4,5,8-naphthalenetetracarboxylic dianhydride 2,2',3,3'-benzophenonetetracarboxylic dianhydride, 2,2',3,3'-biphenyltetracarboxylic dianhydride, 2,2-bis(2,3-dicarboxyphenyl)propane dianhydride, 2,2-bis(2,3-dicarboxyphenyl)-1,1,1,3,3,3-hexafluoropropane dianhydride, bis(2,3-dicarboxyphenyl)ether dianhydride, bis (2,3-dicarboxyphenyl)sulfide dianhydride, bis(2,3-dicarboxyphenyl)sulfone dianhydride, 1,3-bis(2,3-dicarboxyphenoxy)benzene dianhydride, 1,4-bis(2,3-dicarboxyphenoxy) benzene dianhydride, 1,2,5,6-naphthalenetetracarboxylic dianhydride, 1,3-bis(3,4-dicarboxybenzoyl)benzene dianhydride, 1,4-bis(3,4-dicarboxybenzoyl)benzene dianhydride, 1,3-bis(2,3-dicarboxybenzoyl)benzene dianhydride, 1,4-bis (2,3-dicarboxybenzoyl)benzene dianhydride, 4,4'-isophthaloyldiphthalic anhydride, diazodiphenylmethane-3,3',4,4'-tetracarboxylic dianhydride, diazodiphenylmethane-2,2',3, 3'-tetracarboxylic dianhydride, 2,3,6,7-thioxanthonetetracarboxylic dianhydride, 2,3,6,7-anthraquinonetetracarboxylic dianhydride, 2,3,6,7-xanthonetetracarboxylic dianhydride, and ethylenetetracarboxylic dianhydride.

Examples of alicyclic tetracarboxylic dianhydrides include cyclobutanetetracarboxylic dianhydride, 1,2,3,4-cyclopentanetetracarboxylic dianhydride, 1,2,4,5-cyclohexanetetracarboxylic dianhydride, bicyclo[2.2.1]heptane-2,3,5,6-tetracarboxylic dianhydride, bicyclo[2.2.2]octo-7-ene-2,3,5,6-tetracarboxylic dianhydride, bicyclo[2.2.2] octane-2,3,5,6-tetracarboxylic dianhydride, 2,3,5-tricarboxycyclopentylacetic dianhydride, bicyclo[2.2.1] heptane-2,3,5-tricarboxylic-6-acetic dianhydride, 1-methyl-3-ethylcyclohexa-1-ene-3-(1,2),5,6-tetracarboxylic dianhydride, decahydro-1,4,5,8-dimethanonapthalene-2,3,6, 7-tetracarboxylic dianhydride, 4-(2,5-dioxotetrahydrofuran-3-yl)-tetralin-1,2-dicarboxylic dianhydride, and 3,3',4,4'-dicyclohexyltetracarboxylic dianhydride.

When the tetracarboxylic dianhydride has an aromatic ring such as benzene ring, some or all of the hydrogen atoms on the aromatic ring may be substituted by a substituent selected from fluoro group, methyl group, methoxy group, trifluoromethyl group, and trifluoromethoxy group. Furthermore, when the tetracarboxylic dianhydride has an aromatic ring such as a benzene ring, depending on the purpose, some or all of the hydrogen atoms on the aromatic ring, may be substituted by a substituent serving as a crosslinking site, selected from ethynyl group, benzocyclobutene-4'-yl group, vinyl group, allyl group, cyano group, isocyanate group, nitrile group, and isopropenyl group. In addition, depending on the purpose, a group serving as a crosslinking site, such as vinylene group, vinylidene group and/or ethynylidene group, may be incorporated into the main chain skeleton of the tetracarboxylic dianhydride, preferably in an amount that does not impair moldability.

Some of the tetracarboxylic dianhydride units may be derived from hexacarboxylic trianhydrides and/or octacarboxylic tetraanhydrides in order to introduce branches to the polyamic acid or polyimide.

The above tetracarboxylic dianhydrides may be used alone or in combination.

Furthermore, substituent R in general formula (1) may be represented by one of the following formulas (R1) to (R4):

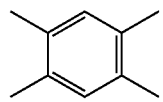

(R1)

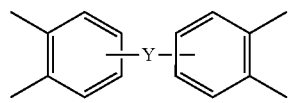

(R2)

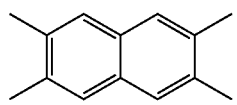

(R3)

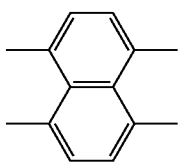

(R4)

where —Y— represents a single bond, —CO—, —O—, —SO$_2$—, —S—, —CH$_2$—, —C(CH$_3$)$_2$—, —CF$_2$—, —C(CF$_3$)$_2$—, —O-Ph-O—, or —O-Ph-C(CH$_3$)$_2$-Ph-O—.

The structure of substituent R can be determined according to the desired characteristics of a polyimide film to be produced. Appropriate selection of substituent R not only results in increased steric stability in the molded polyimide film, but also may allow for arbitrary control of film characteristics, such as thermal coefficient, dimension stability, mechanical strength, flexibility, and adhesion.

Thus, it is preferable to select substituent R according to the intended use of the polyamic acid or polyimide. The repeating unit represented by general formula (1) may have one substituent R, or may have two more different substituents R. For example, two or more different Rs may be randomly distributed in the polyamic acid.

In addition to the repeating unit represented by general formula (1), the polyamic acid of the present invention may have one or more other repeating units as long as the effects of the present invention are not impaired.

The polyamic acid of the present invention may be a blend of two or more different polyamic acids having different monomeric unit sets. All of the blended polyamic acids may be a polyamic acid having the repeating unit represented by general formula (1); only one of them are a polyamic acid having the repeating unit represented by general formula (1), and the others are a polyamic acid which does not have the repeating unit represented by general formula (1); and so forth.

The logarithmic viscosity of a solution of the polyamic acid of the present invention in N-methyl-2-pyrrolidone (concentration: 0.5 g/dl) is preferably 0.1 to 3.0 dl/g at 35° C. This is because application of the polyamic acid solution becomes easy.

The polyamic acid of the present invention can be used in a variety of applications; it can be used as a varnish component. A varnish contains the polyamic acid of the present invention and a solvent. There are no particular limitations on the concentration of the polyamic acid. Solvent removal by means of drying becomes easy at higher concentrations, and therefore, the polyamic acid concentration may be, for example, 15 wt % or higher. Application of a varnish becomes difficult at extreme concentrations, and therefore, the polyamic acid concentration may be, for example, 50 wt % or less.

A varnish containing the polyamic acid of the present invention can be applied onto a metal foil to manufacture a metal clad laminate. For example, when a coat of a varnish containing the polyamic acid of the present invention is formed on a copper or copper alloy foil, it can be used a metal clad laminate for circuit boards. Since the glass transition temperature of polyimide prepared from the polyamic acid of the present invention is high, the metal clad laminate may exhibit high heat resistance when used as a circuit board.

2. Production Process for Polyamic Acid

The polyamic acid of the present invention is prepared by reaction (polymerization) of a diamine component including 1,4-bis(aminomethyl)cyclohexane with a tetracarboxylic dianhydride.

1,4-bis(aminomethyl)cyclohexane contained in a diamine used as a raw material may have trans isomer (Y1) and cis isomer (Y2) represented by the following formulas, respectively. The cis/trans ratio of the raw material 1,4-bis(aminomethyl)cyclohexane is preferably 40/60 to 0/100, more preferably 20/80 to 0/100. The ratio of cis isomer (Y2) to trans isomer (Y1) in the raw material is consistent with the cis isomer (Y2)/trans isomer (Y1) ratio in the repeating unit of the resultant polyamic acid.

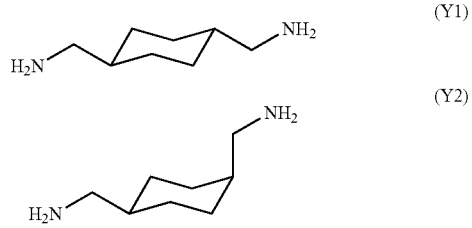

A tetracarboxylic dianhydride used as a raw material is represented by the following formula (3):

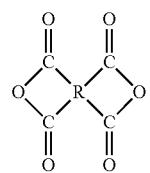

where R is defined the same as in general formula (1).

When the number of moles of a diamine contained in the raw material is defined as X and the number of moles of a tetracarboxylic dianhydride contained in the raw material is defined as Y, the ratio Y/X is preferably 0.9 to 1.1, more preferably 0.95 to 1.05, further preferably 0.97 to 1.03, most preferably 0.99 to 1.01.

The polyamic acid of the present invention can be prepared by, for example, copolymerization of a diamine containing 1,4-bis(aminomethyl)cyclohexane with a tetracarboxylic dianhydride in an aprotic polar solvent or a water-soluble alcohol solvent. Examples of aprotic polar solvents include N-methylpyrrolidone, N,N-dimethylformamide, N,N-dimethylacetamide, dimethylsulfoxide and hexamethylphosphoramide; and ether compounds such as 2-methoxyethanol, 2-ethoxyethanol, 2-(methoxymethoxy)ethoxyethanol, 2-isopropoxyethanol, 2-butoxyethanol, tetrahydrofurfurylalcohol, diethylene glycol, diethylene glycol monomethyl ether, diethylene glycol monoethyl ether, diethylene glycol monobutyl ether, triethylene glycol, triethylene glycol monoethyl ether, tetraethylene glycol, 1-methoxy-2-propanol, 1-ethoxy-2-propanol, dipropylene glycol, dipropylene glycol monomethyl ether, dipropylene glycol monoethyl ether, tripropylene glycol monomethyl ether, polyethylene glycol, polypropylene glycol, tetrahydrofuran, dioxane, 1,2-dimethoxyethane, diethylene glycol dimethyl ether, and diethylene glycol diethyl ether. Examples of water-soluble alcohol solvents include methanol, ethanol, 1-propanol, 2-propanol, tert-butylalcohol, ethylene glycol, 1,2-propanediol, 1,3-propanediol, 1,3-butanediol, 1,4-butanediol, 2,3-butanediol, 1,5-pentanediol, 2-butene-1,4-diol, 2-methyl-2,4-pentanediol, 1,2,6-hexanetriol, and diacetonealcohol.

These solvents can be used alone or in combination. Preferred examples include N,N-dimethylacetamide, N-methylpyrrolidone, and a combination thereof.

There are no particular limitations on the polymerization procedure. For example, a vessel equipped with a stirrer and a nitrogen inlet is prepared. The vessel is purged with nitrogen and charged with the above solvent. A diamine is then added such that a polyimide solution has a solid content of 30 wt %, followed by temperature adjustment and stirring for dissolution. An equimolar amount of a tetracarboxylic dianhydride with respect to the diamine is added to the solution, followed by temperature adjustment and stirring for 1 to 50 hours to yield a polyamic acid.

3. Polyimide

A polyimide of the present invention has a repeating unit represented by the following general formula (2). Specifically, the polyimide has a repeating unit in which the diamine unit is derived from 1,4-bis(aminomethyl)cyclohexane.

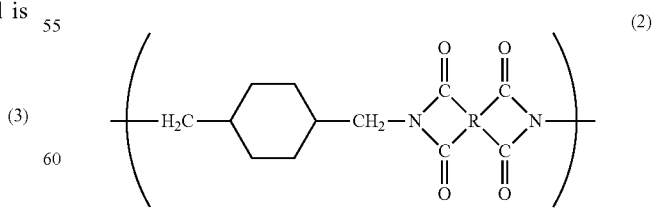

Substituent R in general formula (2) is the same as substituent R in general formula (1).

As with the polyamic acid described above, unit (X) derived from 1,4-bis(aminomethyl)cyclohexane in the polyimide of the present invention may exist as one of the two geometric isomers (cis-trans isomers) shown below. The trans isomer unit is represented by formula (X1), and the cis isomer unit is represented by formula (X2).

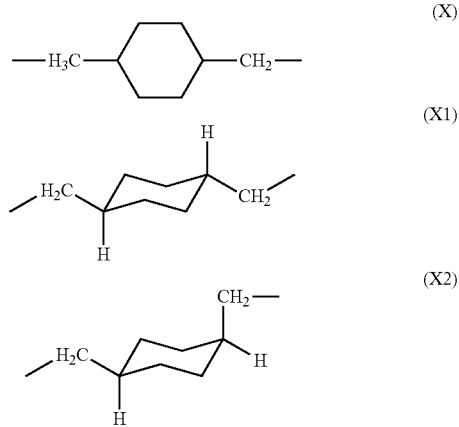

The cis (X2)/trans (X1) ratio of the unit derived from 1,4-bis(aminomethyl)cyclohexane is preferably 40/60 to 0/100, more preferably 20/80 to 0/100, in order to increase the glass transition temperature of the polyimide. For example, the glass transition temperature of the polyimide of the present invention is preferably 250° C. or above. Glass transition temperature may be adjusted by, for example, appropriately changing the cis (X2)/trans (X1) ratio and the structure of substituent R in general formula (2).

The logarithmic viscosity of a solution of the polyimide of the present invention in a 9:1 (weight ratio) mixture solvent of p-chlorophenol and phenol (concentration: 0.5 g/dl) is preferably 0.1 to 3.0 dl/g at 35° C. Within this range the polyimide has a practical molecular weight, and the solution having a desired solid content can be readily applied. When the logarithmic viscosity is too high, degree of polymerization is generally too high, and moreover, solubility may decrease.

The polyimide of the present invention can be prepared by imidization (imide ring closure) of the polyamic acid described above. In particular, a coat of the polyamic acid varnish described above can be heated and dried to produce a polyimide film. By way of example, a polyimide film is formed as follows: after applying a polyamic acid varnish to a metal or glass substrate to a dried polyimide film thickness of the order of 0.1 μm to 1 mm, the varnish is heated for 1 second to 10 hours at 20° C. to 400° C., preferably 150° C. to 350° C., further preferably 200° C. to 300° C., and dried to effect condensation. Thereafter, the polyimide film is peeled off from the substrate, or the substrate is dissolved away.

There are no particular limitations on the method of applying the polyimide varnish of the present invention; any known coater, such as die coater, comma coater, roll coater, gravure coater, curtain coater, spray coater, or lip coater, can be employed.

4. Polyimide Resin Composition

Where necessary, various additives may be added to the polyimide of the present invention to produce a polyimide resin composition. Examples of additives include fillers, wear resistance improvers, flame retardancy improvers, tracking resistance improvers, thermal conductivity improvers, antifoaming agents, levelling agents, surface tension modifiers, and coloring agents. For its high transparency, the polyimide of the present invention can be easily colored by a coloring agent. Moreover, for its high bend resistance, it is less likely to become brittle even when a coloring agent is added abundantly.

The coloring agent may be organic or inorganic, or may be a fluorescent pigment. There are no particular limitations on the color of the coloring agent; color can be appropriately determined depending on the intended use. For example, when the polyimide of the present invention is used as a light reflecting material, light beam reflectivity can be enhanced by the addition of a whitening agent such as white inorganic filler or fluorescent brightener.

Examples of white inorganic fillers include metal oxides such as titanium oxide, zinc oxide, magnesium oxide, alumina, and silica; inorganic metal salts such as calcium carbonate, magnesium carbonate, barium sulfate, calcium sulfate, magnesium sulfate, aluminum sulfate, magnesium chloride, and basic magnesium carbonate; metal hydroxides such as magnesium hydroxide, aluminum hydroxide, and calcium hydroxide; and clay-based minerals such as talc, mica, and kaolin, with titanium oxide and zinc oxide being preferable.

There are no particular limitations on the shape of white inorganic filler particles; they may be acicular, plate-like, or spherical. The average particle diameter of the white inorganic filler is preferably 0.05 to 15 μm, more preferably 0.1 to 10 μm.

The white inorganic filler is preferably added in an amount of 10 to 500 parts by weight, more preferably 20 to 400 parts by weight, per 100 parts by weight of polyimide resin. Within these ranges, sufficient light beam reflectivity can be achieved for the resultant polyimide film and film strength is less likely to drop.

Such a polyimide resin composition can be suitably prepared by mixing the polyamic acid of the present invention with additives such as white inorganic filler to produce a polyamic acid composition, and imidizing the polyamic acid composition.

5. Applications

Since the polyimide of the present invention has excellent heat resistance and folding endurance as described above, the polyimide may be suitably used as a substrate material for circuit boards (polyimide-metal laminates).

That is, a polyimide-metal laminate can be prepared by applying on a metal foil a varnish containing the polyamic acid of the present invention, followed by drying and imidization.

Alternatively, a metal clad laminate can be produced by laminating the polyimide film of the present invention on a metal foil. Lamination may be effected by thermal compression bonding. Thermal compression bonding is preferably performed at a temperature equal to or higher than the glass transition temperature of the polyimide film. Examples of thermal compression bonding devices include hot press machines and heat laminators. There are no particular limitations on the lamination method; however, nip roll lamination is preferable.

After or during lamination, the metal clad laminate is further retained at 150° C. to 400° C., whereby a metal clad laminate can be obtained in which good adhesion is ensured between the metal foil and polyimide film.

As a heater, a typical furnace or autoclave may be employed, for example. Heating atmosphere may be air or inert gas (e.g., nitrogen or argon gas) atmosphere. Heating may be effected by, for example, continuous heating or allowing the metal clad laminate to stand in a furnace while being wound around a core. Heating methods include conduction heating, infrared heating, and a combination thereof. Heating period is, for example, around 0.05 to 5,000 minutes.

Examples of metal foils used for the metal clad laminate include metal foils made of copper, nickel, cobalt, chrome, zinc, aluminum, stainless steel or an alloy thereof. Among them, copper and copper alloy, stainless steel and its alloy, nickel and nickel alloy (including 42 alloy), and aluminum and aluminum alloy are preferable.

The polyimide film to be bonded to a metal foil by thermal compression bonding may be an insulating base film on which a layer of the polyimide resin of the present invention has been previously formed. The insulating base film is preferably flexible.

The material of the flexible insulating base film may be polyimide, polybenzimidazole, polybenzoxazole, polyamide (including aramide), polyetherimide, polyamideimide, polyester (including liquid crystal polyester), polysulfone, polyethersulfone, polyetherketone, or polyetheretherketone, with polyimide, polybenzimidazole, polyamide (including aramide), polyetherimide, polyamideimide, and polyethersulfone being preferable, for example. There are no particular limitations on the thickness of the flexible insulating base film; however, it is preferably 3 to 150 μm.

The metal layer is not limited to a metal foil, and may be a metal layer formed by means of sputtering, vapor deposition or other gas phase method or by electroplating such as electroless plating. The metal layer is formed onto a polyimide film of the present invention or onto a polyimide resin layer formed on an insulating base film.

Vapor deposition methods include, in addition to general vapor deposition, CVD and ion-plating. When forming a metal layer by vapor deposition, the surface of a polyimide resin layer on which the metal layer is to be formed may be subjected to pre-treatment such as alkaline reagent treatment, plasma treatment, or sand blast treatment.

In addition to usage as a circuit board material described above, the polyimide of the present invention is used in various applications where heat resistance and transparency, and folding endurance are required, including display substrate material for displays, (transparent) coating material used for coating display screens or well-designed molded articles, and light reflecting or light shielding material colored by an coloring agent (e.g., inorganic pigment or organic dye). Among other applications, the polyimide of the present invention can be used as a light reflecting material for liquid crystal displays, preferably as a light reflecting material for LED backlight units.

Such light reflecting material is prepared from a polyimide resin composition which contains the polyimide of the present invention and a whitening agent such as white inorganic filler. On a surface of light reflecting material, which is not the light reflecting surface, may be provided with additional layer(s) so as to manufacture a light reflector. Specific examples, particle shape and formulation amount of the white inorganic filler are the same as described above.

The light reflecting material preferably has light reflectivity of 50% or more at 550 nm wavelength. Light reflectivity can be measured with Hitachi U-3010 spectrophotometer (Hitachi High-Technologies Corporation). Specifically, light reflectivity is measured over the range from 300 nm to 800 nm, and a value of light reflectivity measured at 550 nm is employed as a representative value.

The thickness of light reflecting material is preferably 5 to 200 μm, more preferably 10 to 100 μm.

EXAMPLES

Hereinafter, the present invention will be described in detail with reference to Examples, which however shall not be construed as limiting the scope the invention thereto.

The following describes test methods used to test samples prepared in Examples and Comparative Examples.

1) Intrinsic Logarithmic Viscosity (η) of Polyamic Acid

A polyamic acid is dissolved in N,N-dimethylacetamide (DMAc) to a solid content of 0.5 g/dl to produce a polyamic acid solution. The viscosity of the polyamic acid solution is measured at 35° C. using a Ubbelohde viscometer.

2) Glass Transition Temperature (Tg) and Coefficient of Thermal Linear Expansion (CTE)

Measurements are made using TMA-50 manufactured by Shimadzu Co. in a nitrogen stream at a heating rate of 10° C./minute and at a load per unit sectional area of 14 g/mm$^2$. The coefficient of thermal linear expansion is measured at 100° C. to 200° C.

3) Total Light Transmittance

Measurement is made with HZ-2 (TM double beam system) manufactured by Suga Test Instruments Co., Ltd. at an opening size of Φ20 mm with a D65 light source.

4) Evaluation of Folding Endurance

Using the following tester, samples are evaluated for their folding endurance under the following test condition.
Tester: MIT folding endurance tester
Tension: 1.0 kg or 0.5 kg
Folding angle: 135° (on either side)
Folding rate: 175 double folds per minute
Curvature radius: 0.38 mm
Clamp gap: 0.3 mm
Test piece dimension: 120 mm length×15 mm width 5) Calculation of Cis/Trans Ratio of 14BAC $^1$H NMR measurements (solvent: CDCl$_3$) are made on various purified or unpurified 14BACs. Based on the signal intensity ratio over a predetermined magnetic field range, the cis/trans ratio is found. Specifically, the cis-trans ratio is calculated based on the ratio of cis isomer-derived NH$_2$CH$_2$ (2.607 ppm, doublet) to trans isomer-derived NH$_2$CH$_2$ (2.533 ppm, doublet).

6) Tensile Modulus of Elasticity

Dumbbell-shaped test pieces punched out with a punching machine are measured for their tensile modulus of elasticity using a tensile tester (EZ-S, Shimadzu Corporation) under the following condition: gauge length=5 mm, tension rate=30 mm/min. An average of 10 measured values for the integrated area under a stress-strain curve from the origin to rupture is employed as tensile modulus of elasticity.

<Synthesis of Polyamic Acid and Production of Polyimide Film>

Example 1

15.7 g (0.110 mol) of 1,4-bis(aminomethyl)cyclohexane (14BAC) and as an organic solvent 192 g of N,N-dimethylacetamide (DMAc) are charged into a 300 mL five-neck separable flask equipped with a thermometer, a stirrer, a nitrogen inlet and a dropping funnel, and stirred. The cis/trans ratio of 1,4-bis(aminomethyl)cyclohexane is 9/91.

The flask is charged with 32.4 g (0.110 mol) of 3,3',4,4'-biphenyltetracarboxylic dianhydride (BPDA) and placed in a 120° C. oil bath for 5 minutes. Salting out occurs about 3 minutes after addition of BPDA, immediately after which the salt is observed to be re-dissolved in the solvent. After removing the oil bath, the solution is stirred for a further 18 hours at room temperature to yield a solution containing a polyamic acid (polyimide precursor polymer), i.e., a polyimide precursor polymer varnish. The resultant polyamic acid has an intrinsic logarithmic viscosity of 0.94 dl/g (35° C., 0.5 g/dl).

The polyamic acid solution is spread over a glass substrate using a doctor blade. The glass substrate is placed in an oven. In a nitrogen gas stream, the glass substrate is heated from 50° C. to 250° C. over 2 hours, and heated at 250° C. for a further 2 hours to produce a colorless, transparent self-supporting polyimide film with 20 μm thickness. The polyimide film has a glass transition temperature (Tg) of 267° C. and a coefficient of thermal linear expansion of 41 ppm/K. The results are shown in Table 1.

Example 2

118 g (0.400 mol) of 3,3',4,4'-biphenyltetracarboxylic dianhydride (BPDA) and as an organic solvent 290 g of N,N-dimethylacetamide (DMAc) are charged into a 1 L five-neck separable flask equipped with a thermometer, a stirrer, a nitrogen inlet and a dropping funnel, and stirred in a 0° C. ice bath to produce a slurry-like liquid. 56.9 g (0.400 mol) of 1,4-bis(aminomethyl)cyclohexane (14BAC) and 117 g of N,N-dimethylacetamide (DMAc) loaded in the dropping funnel are added dropwise to the solution over 2 hours. The cis/trans ratio of 1,4-bis(aminomethyl)cyclohexane is 9/91.

After addition, the solution is stirred for a further 16 hours at room temperature to yield a polyimide precursor polymer varnish. The resultant polyamic acid has a logarithmic viscosity of 0.73 dL/g (35° C., 0.5 g/dl). A polyimide film is prepared as in Example 1. Test results are shown in Table 1.

Examples 3 to 5 and Comparative Examples 1 and 2

Polyamic acids of Examples 3 to 5 and Comparative Examples 1 to 2 are prepared as in Example 1 while changing the cis/trans ratio of 1,4-bis(aminomethyl)cyclohexane in accordance with Table 1. Polyimide films are then produced as in Example 1. Test results are also shown in Table 1.

14BAC having a lower trans isomer content is used, produced a polyimide having a glass transition temperature of less than 250° C.

Example 6

A polyamic acid is prepared as in Example 1 except that 3,3',4,4'-benzophenonetetracarboxylic dianhydride (BTDA) is used instead of 3,3',4,4'-biphenyltetracarboxylic dianhydride (BPDA).

Comparative Example 3

A polyamic acid is prepared as in Example 6 except that the cis/trans ratio of 1,4-bis(aminomethyl)cyclohexane is changed to 60/40.

Example 7

A polyamic acid is prepared as in Example 1 except that 3,3',4,4'-diphenylsulfonetetracarboxylic dianhydride (DSDA) is used instead of 3,3',4,4'-biphenyltetracarboxylic dianhydride (BPDA).

Comparative Example 4

A polyamic acid is prepared as in Example 7 except that the cis/trans ratio of 1,4-bis(aminomethyl)cyclohexane is changed to 60/40.

Example 8

A polyamic acid is prepared as in Example 1 except that oxydiphthalic anhydride (ODPA) is used instead of 3,3',4,4'-biphenyltetracarboxylic dianhydride (BPDA).

Comparative Example 5

A polyamic acid is prepared as in Example 8 except that the cis/trans ratio of 1,4-bis(aminomethyl)cyclohexane is changed to 60/40.

TABLE 1

| | Acid dianhydride | 14BAC cis/trans ratio | η (dL/g) | $T_g$ (° C.) | CTE (ppm/K) | Total light transmittance (%) | Tensile Modulus of Elasticity (GPa) | MIT folding endurance (Number of double folds until failure) |
|---|---|---|---|---|---|---|---|---|
| Ex. 1 | BPDA | 9/91 | 0.94 | 267 | 41 | 88 | 2.64 | >100,000 @ 1.0 kg tension |
| Ex. 2 | BPDA | 9/91 | 0.73 | 258 | 45 | 88 | 2.42 | >100,000 @ 1.0 kg tension |
| Ex. 3 | BPDA | 11/89 | 0.97 | 266 | 44 | 88 | 2.56 | >100,000 @ 1.0 kg tension |
| Ex. 4 | BPDA | 19/81 | 0.83 | 262 | 41 | 88 | 2.85 | >100,000 @ 1.0 kg tension |
| Ex. 5 | BPDA | 37/63 | 0.76 | 253 | 43 | 88 | 2.96 | >100,000 @ 1.0 kg tension |
| Comp. Ex. 1 | BPDA | 60/40 | 0.99 | 245 | 43 | 88 | 2.80 | >100,000 @ 1.0 kg tension |
| Comp. Ex. 2 | BPDA | 63/37 | 0.95 | 241 | 45 | 88 | 2.99 | >100,000 @ 1.0 kg tension |

Examples 1 to 5, where 14BAC having a trans isomer content of greater than 60% is used, all produced a polyimide having a glass transition temperature of greater than 250° C. By contrast, Comparative Examples 1 and 2, where The above-described tests are conducted with the polyamic acids prepared in Examples 6 to 8 and Comparative Examples 3 and 5 as varnishes. Test results are shown in Table 2.

TABLE 2

| | Acid dianhydride | 14BAC cis/trans ratio | η (dL/g) | $T_g$ (° C.) | CTE (ppm/K) | Total light transmittance (%) | Tensile Modulus of Elasticity (GPa) | MIT folding endurance (Number of double folds until failure) |
|---|---|---|---|---|---|---|---|---|
| Ex. 6 | BTDA | 9/91 | 1.02 | 236 | 52 | 82 | 2.95 | 7,400 @0.5 kg tension |
| Ex. 7 | DSDA | 9/91 | 0.21 | 273 | 48 | 89 | 2.93 | 15,300 @0.5 kg tension |
| Ex. 8 | ODPA | 9/91 | 0.87 | 228 | 55 | 89 | 2.77 | >100,000 @0.5 kg tension |
| Comp. Ex. 3 | BTDA | 60/40 | 0.91 | 227 | 46 | 77 | 2.81 | 6,600 @0.5 kg tension |
| Comp. Ex. 4 | DSDA | 60/40 | 0.32 | 254 | 47 | 89 | 3.04 | 4,100 @0.5 kg tension |
| Comp. Ex. 5 | ODPA | 60/40 | 0.81 | 209 | 55 | 89 | 2.89 | 51,700 @0.5 kg tension |

When comparing Example 6 to Comparative Example 3, Example 7 to Comparative Example 4, and Example 8 to Comparative Example 5, values of glass transition temperature in Examples are high compared to those in Comparative Examples in spite of the fact that the same acid dianhydride is used. This is considered to be derived from the difference in the cis/trans ratio of 1,4-bis(aminomethyl)cyclohexane between Example and Comparative Example (Examples 6 to 8 are richer in trans isomer than Comparative Examples 3 to 5, respectively). Moreover, Examples 6 to 8 exhibit superior folding endurance compared to Comparative Examples 3 to 5. It can be thus seen that higher trans isomer content contributes to improved folding endurance.

Examples 9 and 10

Polyamic acids are prepared as in Example 1 except that a combination of BPDA and PMDA is used as an acid dianhydride. Polyimide films are then produced. Test results are shown in Table 3.

Examples 11 and 12

Polyamic acids are prepared as in Example 1 except that a combination of 14BAC (cis/trans ratio: 9/91) and NBDA is used as a diamine and that PMDA is used as an acid dianhydride. Polyimide films are then produced. Test results are shown in Table 3.

Example 13

A polyamic acid (polyamic acid of Synthesis 1) is prepared as in Example 1 except that norbornanediamine (NBDA) is used instead of 1,4-bis(aminomethyl)cyclohexane (14BAC). The resultant polyamic acid has an intrinsic logarithmic viscosity of 0.51 dL/g (35° C., 0.5 g/dl). The polyamic acid of Synthesis 1 and the polyamic acid of Example 1 are mixed in a molar ratio of 1:3. From the mixture varnish, a polyimide film is produced as in Example 1. Test results are shown in Table 4.

Example 14

A polyamic acid (polyamic acid of Synthetic 2) is prepared as in Example 1 except that pyromellitic dianhydride (PMDA) is used instead of 3,3',4,4'-diphenyltetracarboxylic dianhydride (BPDA). The resultant polyamic acid has an intrinsic logarithmic viscosity of 0.69 dL/g (35° C., 0.5 g/dl). The polyamic acid of Synthesis 2 and the polyamic acid of Example 1 are mixed in a molar ratio of 1:1. From the mixture varnish, a polyimide film is produced as in Example 1. Test results are shown in Table 4.

Example 15

The polyamic acid of Synthesis 2 and the polyamic acid of Example 1 are mixed in a molar ratio of 1:3. From the mixture varnish, a polyimide film is produced as in Example 1. Test results are shown in Table 4.

Example 16

A polyamic acid is prepared as in Example 1 except that as a diamine compound norbornanediamine (NBDA) is used instead of 1,4-bis(aminomethyl)cyclohexane (14BAC) and that as a tetracarboxylic dianhydride pyromellitic dianhydride (PMDA) is used instead of 3,3',4,4'-biphenyltetracarboxylic dianhydride (BPDA) (polyamic acid of Synthesis 3). The resultant polyamic acid has an intrinsic logarithmic viscosity of 0.58 dL/g (35° C., 0.5 g/dl). The polyamic acid of Synthesis 3 and the polyamic acid of Example 1 are mixed in a molar ratio of 1:1. From the mixture varnish, a polyamide film is produced as in Example 1. Test results are shown in Table 4.

TABLE 3

| | Acid dianhydride | | Diamine | | η (dL/g) | $T_g$ (° C.) | CTE (ppm/K) | Total light transmittance (%) | Tensile Modulus of Elasticity (GPa) | MIT folding endurance (Number of double folds until failure) |
|---|---|---|---|---|---|---|---|---|---|---|
| | BPDA | PMDA | 14BAC | NBDA | | | | | | |
| Ex. 9 | 0.5 | 0.5 | 1 | 0 | 0.85 | 302 | 42 | 89 | 2.28 | >100,000 @1.0 kg tension |

TABLE 3-continued

| | Acid dianhydride | | Diamine | | η | $T_g$ | CTE | Total light transmittance | Tensile Modulus of Elasticity | MIT folding endurance (Number of double folds |
|---|---|---|---|---|---|---|---|---|---|---|
| | BPDA | PMDA | 14BAC | NBDA | (dL/g) | (° C.) | (ppm/K) | (%) | (GPa) | until failure) |
| Ex. 10 | 0.75 | 0.25 | 1 | 0 | 0.76 | 278 | 46 | 88 | 2.21 | >100,000 @1.0 kg tension |
| Ex. 11 | 0 | 1 | 0.25 | 0.75 | 0.5 | 296 | 44 | 89 | 2.05 | 23,000 @0.5 kg tension |
| Ex. 12 | 0 | 4 | 0.5 | 0.5 | 0.68 | 365 | 44 | 90 | 1.95 | 36,000 @0.5 kg tension |

Values in [Acid dianhydride] or [Diamine] represent the copolymerization ratio of the monomeric unit in polyamic acid.

TABLE 4

| | Acid dianhydride | | Diamine | | η | $T_g$ | CTE | Total light transmittance | Tensile Modulus of Elasticity | MIT folding endurance (Number of double folds |
|---|---|---|---|---|---|---|---|---|---|---|
| | BPDA | PMDA | 14BAC | NBDA | (dL/g) | (° C.) | (ppm/K) | (%) | (GPa) | until failure) |
| Ex. 13 | 1.00 | 0.00 | 0.75 | 0.25 | 0.72 | 252 | 48 | 88 | 2.82 | >100,000 @1.0 kg tension |
| Ex. 14 | 0.50 | 0.50 | 1.00 | 0.00 | 0.87 | 289 | 45 | 89 | 2.22 | >100,000 @1.0 kg tension |
| Ex. 15 | 0.75 | 0.25 | 1.00 | 0.00 | 0.85 | 264 | 47 | 88 | 2.46 | >100,000 @1.0 kg tension |
| Ex. 16 | 0.50 | 0.50 | 0.50 | 0.50 | 0.69 | 275 | 49 | 88 | 2.30 | 22,000 @0.5 kg tension |

Values in [Acid dianhydride] or [Diamine] represent the total content of the monomeric unit in mixture polyamic acid.

As seen from Table 3, even when a combination of 1,4-bis(aminomethyl)cyclohexane and other diamine is used as a diamine unit of polyimide, the use of 1,4-bis(aminomethyl)cyclohexane that is rich in trans isomer provides a polyimide film that offers high Tg as well as excellent folding endurance.

Moreover, as seen from Table 4, even when a mixture polyimide is used that consists of a polyimide having 1,4-bis(aminomethyl)cyclohexane as a diamine unit and a polyimide having other diamine as a diamine unit, the use of 1,4-bis(aminomethyl)cyclohexane that is rich in trans isomer provides a polyimide film that offers high Tg as well as excellent folding endurance.

Example 17

Acicular titanium oxide (FTL-300, Ishihara Sangyo Kaisha Ltd.; fiber length: 5.15 μm, fiber diameter: 0.27 μm) is added in the polyamic acid solution of Example 1 in N,N-dimethylacetamide in an amount of 55 parts by weight per 100 parts by weight of the polyamic acid of Example 1, to produce a white polyamic acid solution. The polyamic acid solution is applied over a glass substrate with a bar coater with a 0.6 mm gap, heated from room temperature to 250° C. over 2 hours in a nitrogen gas stream, and heated at 250° C. for a further 2 hours to complete imidization of the applied film. In this way a white polyimide film is produced.

Example 18

A white polyimide film is produced as in Example 17 except that acicular titanium oxide (FTL-300, Ishihara Sangyo Kaisha Ltd.) is added in an amount of 20 parts by weight per 100 parts of the polyamic acid.

Example 19

A white polyimide film is produced as in Example 17 except that the bar coater gap is set to 0.25 mm.

Example 20

A white polyimide film is produced as in Example 17 except that acicular titanium oxide (FTL-200, Ishihara Sangyo Kaisha Ltd.; fiber length: 2.86 μm, fiber diameter: 0.21 μm) is used instead of acicular titanium oxide (FTL-300, Ishihara Sangyo Kaisha Ltd.).

Examples 21 and 22

White polyimide films are produced as in Example 17 except that the added amount of acicular titanium oxide (FTL-200, Ishihara Sangyo Kaisha Ltd.) or the bar coater gap is changed in accordance with Table 5.

Example 23

A white polyimide film is produced as in Example 17 except that acicular titanium oxide (FTL-110, Ishihara Sangyo Kaisha Ltd.; fiber length: 1.68 μm, fiber diameter: 0.13 μm) is used instead of acicular titanium oxide (FTL-300, Ishihara Sangyo Kaisha Ltd.).

Examples 24 and 25

White polyimide films are produced as in Example 23 except that the added amount of acicular titanium oxide (FTL-110, Ishihara Sangyo Kaisha Ltd.) or the bar coater gap is changed in accordance with Table 5.

Example 26

A white polyimide film is produced as in Example 17 except that acicular titanium oxide (FTL-100, Ishihara Sangyo Kaisha Ltd.; fiber length: 1.68 μm, fiber diameter: 0.13 μm) is used instead of acicular titanium oxide (FTL-300, Ishihara Sangyo Kaisha Ltd.).

Examples 27 and 28

White polyimide films are produced as in Example 26 except that the added amount of acicular titanium oxide (FTL-100, Ishihara Sangyo Kaisha Ltd.) or the bar coater gap is changed in accordance with Table 5.

Example 29

A white polyimide film is produced as in Example 17 except that spherical titanium oxide (R-980, Ishihara Sangyo Kaisha Ltd.; average particle size: 0.24 μm) is used instead of acicular titanium oxide (FTL-300, Ishihara Sangyo Kaisha Ltd.).

Examples 30 and 31

White polyimide films are produced as in Example 29 except that the added amount of spherical titanium oxide (R-980, Ishihara Sangyo Kaisha Ltd.) or the bar coater gap is changed in accordance with Table 5.

Example 32

A white polyimide film is produced as in Example 17 except that zinc oxide (average particle size: 5 μm) is used instead of acicular titanium oxide (FTL-300, Ishihara Sangyo Kaisha Ltd.).

Examples 33 and 34

White polyimide films are produced as in Example 32 except that the added amount of zinc oxide or the bar coater gap is changed in accordance with Table 5.

The white polyimide films prepared in Examples 17 to 34 are measured for reflectivity for light at 550 nm wavelength in accordance with the procedure described below. Measurement results are shown in Table 5.

TABLE 5

|  | White inorganic filler | Added amount (parts by weight) | Bar coater gap (mm) | Film thickness (μm) | Light reflectivity (%) |
|---|---|---|---|---|---|
| Ex. 17 | Acicular titanium oxide: FTL-300 | 55 | 0.6 | 65 | 84 |
| Ex. 18 | Acicular titanium oxide: FTL-300 | 20 | 0.6 | 48 | 76 |
| Ex. 19 | Acicular titanium oxide: FTL-300 | 55 | 0.25 | 20 | 57 |
| Ex. 20 | Acicular titanium oxide: FTL-200 | 55 | 0.6 | 76 | 85 |
| Ex. 21 | Acicular titanium oxide: FTL-200 | 20 | 0.6 | 58 | 77 |
| Ex. 22 | Acicular titanium oxide: FTL-200 | 55 | 0.25 | 24 | 61 |
| Ex. 23 | Acicular titanium oxide: FTL-110 | 55 | 0.6 | 97 | 83 |
| Ex. 24 | Acicular titanium oxide: FTL-110 | 20 | 0.6 | 60 | 75 |
| Ex. 25 | Acicular titanium oxide: FTL-110 | 55 | 0.25 | 29 | 60 |
| Ex. 26 | Acicular titanium oxide: FTL-100 | 55 | 0.6 | 77 | 86 |
| Ex. 27 | Acicular titanium oxide: FTL-100 | 20 | 0.6 | 55 | 78 |
| Ex. 28 | Acicular titanium oxide: FTL-100 | 55 | 0.25 | 25 | 58 |
| Ex. 29 | Spherical titanium oxide: R-980 | 55 | 0.6 | 75 | 89 |
| Ex. 30 | Spherical titanium oxide: R-980 | 20 | 0.6 | 50 | 83 |
| Ex. 31 | Spherical titanium oxide: R-980 | 55 | 0.25 | 20 | 64 |
| Ex. 32 | Zinc oxide | 55 | 0.6 | 64 | 67 |
| Ex. 33 | Zinc oxide | 20 | 0.6 | 48 | 51 |
| Ex. 34 | Zinc oxide | 55 | 0.25 | 23 | 50 |

Measurement of Light Reflectivity

With Hitachi U-3010 spectrophotometer (Hitachi High-Technologies Corporation), the light reflectivity of the polyimide film is measured over the range from 300 nm to 800 nm, and a value of light reflectivity measured at 550 nm is employed as light reflectivity.

All of the polyimide films prepared in Examples 17 to 34 are evenly colored in pure white. As seen from the results of Examples 17 to 34, white polyimide films containing zinc oxide or titanium oxide exhibit at least a certain level of light reflectivity. In particular, it can be seen that titanium oxide provides high light reflectivity compared to zinc oxide even when they are added in equal amounts. Moreover, it can be seen that spherical titanium oxide provides high light reflectivity compared to acicular titanium oxide.

This application is entitled and claims the priority of Japanese Patent Application No. 2009-51102 filed on Mar. 4, 2009, the disclosure of which including the specification, drawing and abstract is herein incorporated by reference in its entirety.

INDUSTRIAL APPLICABILITY

The present invention provides a polyimide resin with high heat resistance without impairing its inherent properties. The polyimide resin of the present invention is suitable for coating materials, display materials for displays, and circuit board materials.

The invention claimed is:
1. A polyimide having at least two different repeating units each represented by general formula (2) and having different R,

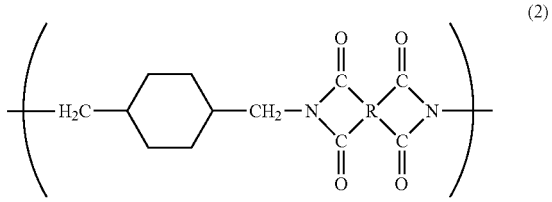
(2)

wherein 1,4-bismethylenecyclohexane skeletons (X) in general formula (2) are a trans isomer represented by formula (X1) or a cis isomer represented by formula (X2), and

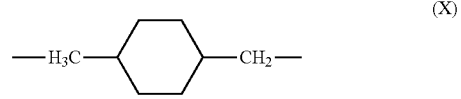
(X)

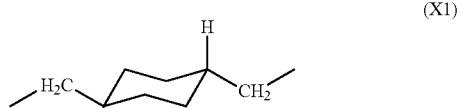
(X1)

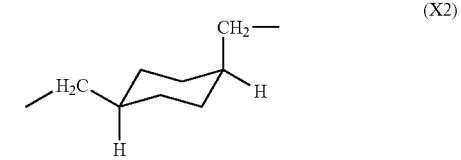
(X2)

a content of the trans isomer is 63% to 91%, and a content of the cis isomer is 9% to 37%, with respect to the total content of the cis and trans isomers being 100%, where the at least two different repeating units include a repeating unit having R represented by the following formula (R1) and a repeating unit having R represented by the following formula (R2),

(R1)

(R2)

where —Y— represents a single bond.

2. The polyimide according to claim 1, wherein the content of the trans isomer is 80% to 91%, and the content of the cis isomer is 9% to 20%, with respect to the total content of the cis and trans isomers being 100%.

3. The polyimide according to claim 1, wherein a logarithmic viscosity of the polyimide in a 9:1 (weight ratio) mixture solvent of p-chlorophenol and phenol is 0.1 to 3.0 dl/g, as measured at 35° C. and at a polyimide concentration of 0.5 g/dl.

4. A polyimide film comprising the polyimide according to claim 1.

5. The polyimide film according to claim 4, wherein a glass transition temperature is 250° C. or above.

6. A metal clad laminate obtained by laminating together the polyimide film according to claim 4 and a metal foil.

7. A polyimide resin composition comprising the polyimide according to claim 1 and a coloring agent.

8. The polyimide resin composition according to claim 7, wherein the coloring agent is a whitening agent.

9. The polyimide resin composition according to claim 8, wherein the whitening agent is titanium oxide.

10. A light reflector comprising the polyimide resin composition according to claim 8 as a light reflecting material.

11. A display substrate material comprising the polyimide according to claim 1.

12. A circuit board material comprising the polyimide according to claim 1.

13. A coating material comprising the polyimide according to claim 1.

14. A display substrate material comprising the polyimide resin composition according to claim 7.

15. A circuit board material comprising the polyimide resin composition according to claim 7.

16. A coating material comprising the polyimide resin composition according to claim 7.

17. A process for producing a polyimide comprising:
reacting together 1,4-bis(aminomethyl)cyclohexane and at least two different tetracarboxylic dianhydrides each represented by formula (3) and having different R, to thereby obtain a polyamic acid,

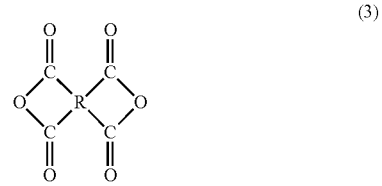
(3)

wherein a content of a trans isomer of the 1,4-bis(aminomethyl)cyclohexane represented by formula (Y1) is 63% to 91%, and a content of a cis isomer of the 1,4-bis(aminomethyl)cyclohexane represented by formula (Y2) is 9% to 37%, with respect to the total content of the cis and trans isomers being 100%,

where the at least two different repeating units include a repeating unit having R represented by the following formula (R1) and a repeating unit having R represented by the following formula (R2), (R1)

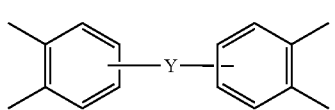
where —Y— represents a single bond, and thermally or chemically imidizing the polyamic acid.
* * * * *